(12) United States Patent
Kim et al.

(10) Patent No.: US 8,921,940 B2
(45) Date of Patent: Dec. 30, 2014

(54) SEMICONDUCTOR DEVICE AND A METHOD FOR FABRICATING THE SAME

(71) Applicant: Samsung Electronics Co., Ltd., Suwon-si, Gyeonggi-do (KR)

(72) Inventors: Jin-Bum Kim, Seoul (KR); Suk-Hun Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/839,870

(22) Filed: Mar. 15, 2013

(65) Prior Publication Data

US 2014/0264597 A1 Sep. 18, 2014

(51) Int. Cl.
*H01L 29/66* (2006.01)
*H01L 27/12* (2006.01)
*H01L 21/76* (2006.01)

(52) U.S. Cl.
CPC ............ *H01L 27/1211* (2013.01); *H01L 21/76* (2013.01)
USPC ............ 257/347; 257/365; 257/353; 257/342

(58) Field of Classification Search
CPC ........................... H01L 45/06; H01L 45/1608
USPC .................................................. 257/347, 365
See application file for complete search history.

(56) References Cited

U.S. PATENT DOCUMENTS

| | | | |
|---|---|---|---|
| 7,005,700 B2 | 2/2006 | Lee | |
| 7,323,375 B2 | 1/2008 | Yoon et al. | |
| 7,358,121 B2 | 4/2008 | Chau et al. | |
| 7,442,596 B2 | 10/2008 | Lee et al. | |
| 7,510,939 B2 | 3/2009 | Furukawa et al. | |
| 7,525,160 B2 | 4/2009 | Kavalieros et al. | |
| 7,692,254 B2 | 4/2010 | Anderson et al. | |
| 7,700,449 B2 | 4/2010 | Lee | |
| 7,723,762 B2 | 5/2010 | Kim et al. | |
| 7,741,200 B2* | 6/2010 | Cho et al. | ...................... 438/530 |
| 7,773,341 B2* | 8/2010 | Zhang et al. | ............. 360/125.11 |
| 7,811,889 B2 | 10/2010 | Trivedi et al. | |
| 8,026,553 B2* | 9/2011 | Shino | ............................ 257/365 |
| 8,138,100 B2 | 3/2012 | Furukawa et al. | |
| 8,153,493 B2 | 4/2012 | Lee | |
| 8,174,073 B2 | 5/2012 | Lee et al. | |
| 8,263,451 B2 | 9/2012 | Su et al. | |

(Continued)

FOREIGN PATENT DOCUMENTS

KR 1020070002739 1/2007

*Primary Examiner* — Zandra Smith
*Assistant Examiner* — Damian A Hillman
(74) *Attorney, Agent, or Firm* — F. Chau & Associates, LLC

(57) ABSTRACT

To fabricate a semiconductor device, a fin is formed to protrude from a substrate. The fin is extended in a first direction. A gate line is formed on the fin and the substrate. The gate line is extended in a second direction crossing the first direction. An amorphous material layer is conformally formed to cover the substrate, the fin, and the gate line. The amorphous material layer is partially removed, thereby forming a first remaining amorphous layer on side walls of the fin and a second remaining amorphous layer on side walls of the gate line. The first remaining amorphous layer and the second remaining amorphous layer are annealed and the first remaining amorphous material layer and the second remaining amorphous material layer are crystallized into a monocrystalline material layer and a polycrystalline material layer, respectively. The polycrystalline material layer is removed.

11 Claims, 14 Drawing Sheets

(56) References Cited

U.S. PATENT DOCUMENTS

| | | |
|---|---|---|
| 2011/0073952 A1 | 3/2011 | Kwok et al. |
| 2011/0095378 A1 | 4/2011 | Lee et al. |
| 2011/0183508 A1 | 7/2011 | Chan et al. |
| 2012/0142182 A1 | 6/2012 | Furukawa et al. |
| 2012/0315732 A1* | 12/2012 | Kang et al. ............... 438/197 |
| 2013/0234101 A1* | 9/2013 | Sasago et al. ............... 257/4 |

* cited by examiner

US 8,921,940 B2

SEMICONDUCTOR DEVICE AND A METHOD FOR FABRICATING THE SAME

TECHNICAL FIELD

The present inventive concept relates to a semiconductor device and a method for fabricating the same.

DESCRIPTION OF RELATED ART

As semiconductor devices become highly integrated, short channel effects arise. A three dimensional (3D) structure of fin field effect transistors (FinFET) has been proposed to suppress short channel effects. Korean Registered Patent No. 10-0693788 discloses FinFET including fins covered by a charge activation film.

SUMMARY

According to an exemplary embodiment of the inventive concept, to fabricate a semiconductor device, a fin is formed to protrude from a substrate. The fin is extended in a first direction. A gate line is formed on the fin and the substrate and extended in a second direction crossing the first direction. An amorphous material layer is conformally formed to cover the substrate, the fin, and the gate line. The amorphous material layer is partially removed, thereby forming a first remaining amorphous layer on side walls of the fin and a second remaining amorphous layer on side walls of the gate line. The first remaining amorphous layer and the second remaining amorphous layer are annealed and the first remaining amorphous material layer and the second remaining amorphous material layer are crystallized into a monocrystalline material layer and a polycrystalline material layer, respectively. The polycrystalline material layer is removed.

According to an exemplary embodiment of the inventive concept, a semiconductor device includes a first fin and a second fin protruding from a substrate and extending in a first direction. The second fin is spaced apart from the first fin. A gate line is disposed on the first fin and the second fin. The gate line is extended in a second direction crossing the first direction. First fin spacers are formed on both side walls of the first fin. Second fin spacers are formed on both side walls of the second fin. The first fin spacers and the second fin spacers are spaced apart from each other.

According to an exemplary embodiment of the inventive concept, a semiconductor device includes a fin protruding from a substrate and extending in a first direction. A gate line and a gate spacer cover a part of the fin and extending in a second direction substantially perpendicular to the first direction. The gate spacer is disposed on both side walls of the gate line. A fin spacer is disposed on both side walls of another part of the fin.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
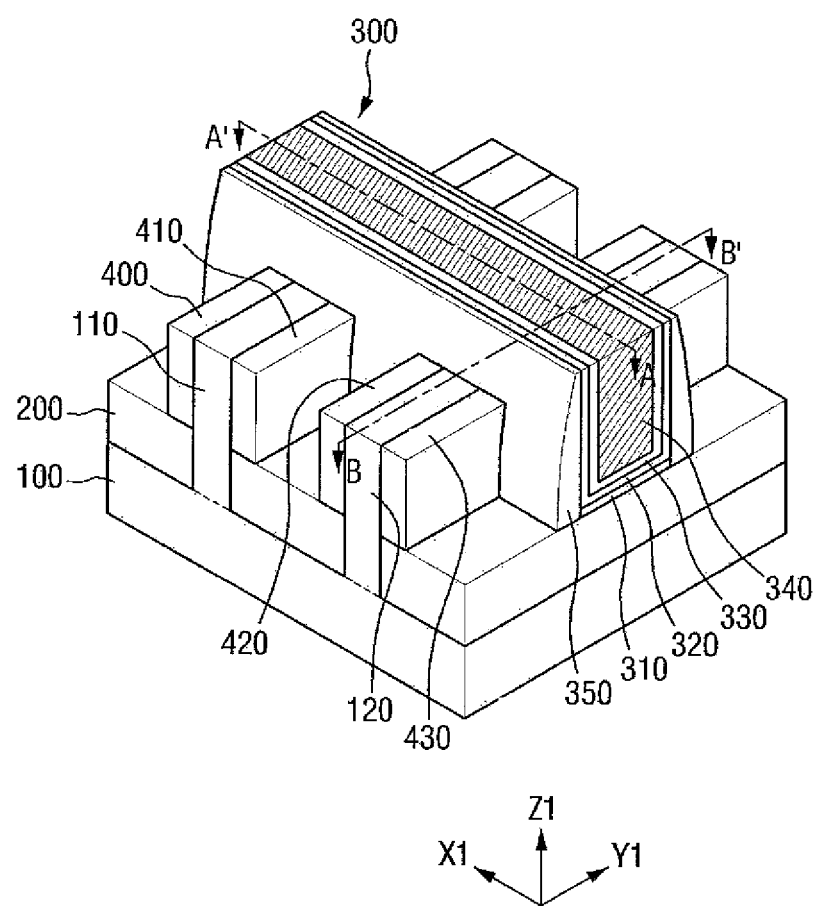
FIG. 1 shows a perspective view of a semiconductor device according to an exemplary embodiment of the present inventive concept.

Exemplary embodiments of the inventive concept will be described below in more detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

It will also be understood that when a layer is referred to as being "on" another layer or substrate, it can be directly on, connected or coupled to, the other layer or substrate, or intervening layers may also be present. In contrast, when an element is referred to as being "directly on" another element, there are no intervening elements present. As used herein, the singular forms "a," "an," and "the" are intended to include the plural forms as well, unless the context clearly indicates otherwise.

A semiconductor device and a method for fabricating the same to be described hereinafter relate to monocrystalline fin spacers crystallized from an amorphous material on side walls of fins. This structure of monocrystalline serves to increase a contact margin of the fins.

With a SEG (Selective Epitaxy Growth) process applied to form a fin structure, the fin structure may include a shape of a diamond due to epitaxial growth. Such diamond shape fin structure may be extended into a region between adjacent fin structures and may cause the adjacent fin structures to come in contact with each other. Once two adjacent fin structures merge, the single crystals rapidly grow in the direction of <100> and have an irregular shape.

As semiconductor devices are decreasing in size, it becomes necessary to control a shape of fins in forming the fins. For example, the irregular shape of fins, as described above, may adversely affect the following process such as forming an interlayer insulating film on the fins. This is so, because such irregular shape prevents the interlayer insulating film from filling gaps between adjacent fins. According to an exemplary embodiment of the present inventive concept, fin spacers are formed on side walls of the fins, and thus the fin spacers serve to suppress the fins from having a diamond shape. Accordingly, the adjacent fins do not come in contact with each other.

Figure 2:
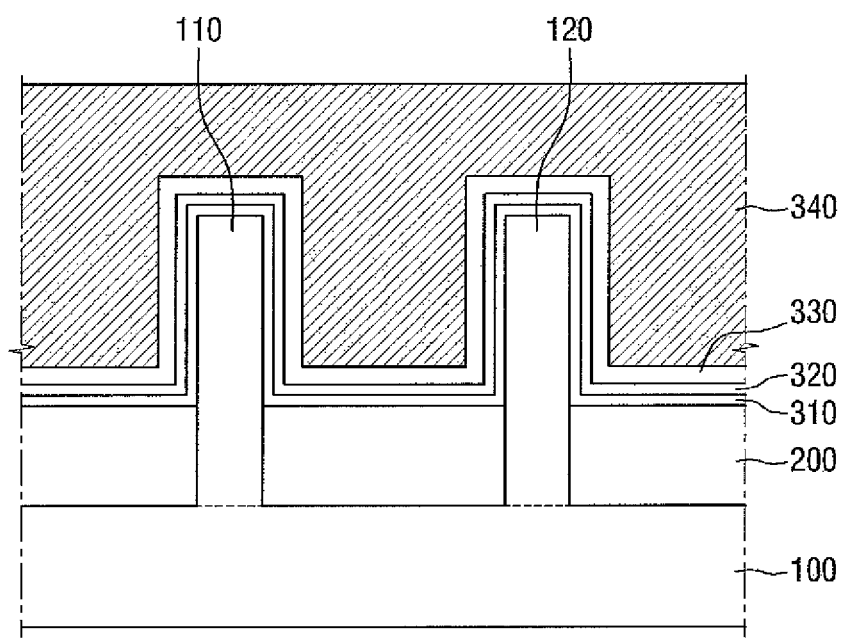
FIG. 2 shows a cross-sectional view taken along line A-A' in FIG. 1.

FIG. 1 shows a perspective view of a semiconductor device according to an exemplary embodiment of the present inventive concept. FIG. 2 shows a cross-sectional view taken along line A-A' in FIG. 1, and FIG. 3 shows a cross-sectional view taken along line B-B' in FIG. 1.

Figure 3:
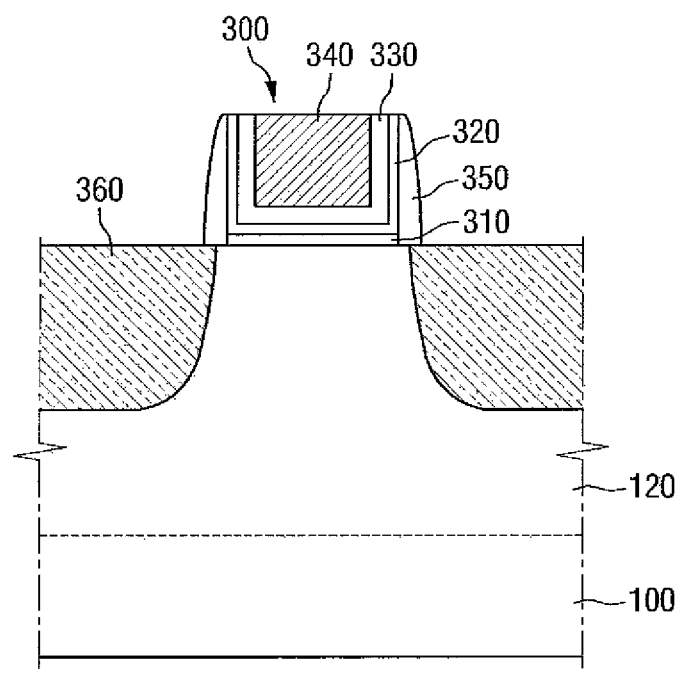
FIG. 3 shows a cross-sectional view taken along line B-B' in FIG. 1.

Referring to FIGS. 1 to 3, the semiconductor device according to an exemplary embodiment of the present inventive concept includes a substrate 100, an isolation film pattern 200, a first fin 110, a second fin 120, a gate line 300, a source/drain 360, first fin spacers 400 and 410, and second fin spacers 420 and 430.

The substrate 100 may include Si, Ge, SiGe, GaP, GaAs, SiC, SiGeC, InAs, and/or InP. Further, the substrate 100 may be a rigid substrate, such as a SOI (Silicon On Insulator) substrate, a gallium arsenide substrate, a silicon germanium substrate, a ceramic substrate, a quartz substrate, or a glass substrate for display, or a flexible plastic substrate made of polyimide, polyester, polycarbonate, polyethersulfone, polymethylmethacrylate, polyethylene naphthalate, and/or polyethyleneterephthalate.

The isolation film pattern 200 is formed on the substrate 100 and serves to electrically/physically isolate the first fin 110 and the second fin 120. The isolation film pattern 200 may include an insulating film, such as an HDP oxide film, a SOG oxide film, and/or a CVD oxide film, but is not limited thereto.

The first fin 110 is formed to protrude from the substrate 100. The first fin 110 is extended along a second direction Y1. The first fin 110 may be a part of the substrate 100, and may include an epitaxial layer grown from the substrate 100. The isolation film pattern 200 may cover an upper surface of the substrate 100 and lower side walls of the first fin 110.

The second fin 120 is formed to protrude from the substrate 100, and is spaced apart from the first fin 110 along a first direction X1. The second fin 120 is extended along the second direction Y1. The second fin 120 may be a part of the substrate 100, and may include an epitaxial layer grown from the substrate 100. The isolation film pattern 200 may cover the upper surface of the substrate 100 and lower side walls of the second fin 120.

The gate line 300 is formed on the first and second fins 110 and 120. The gate line 300 is extended along the first direction X1. The gate line 300 includes an interface film pattern 310, a gate insulating film 320, a work function adjustment film pattern 330, a gate metal pattern 340, and gate spacers 350, which are sequentially formed on the first and second fins 110 and 120.

The interface film pattern 310 is formed on the isolation film pattern 200 and the first and second fins 110 and 120. The interface film pattern 310 may serve to prevent an interface defect between the isolation film pattern 200 and the gate insulating film pattern 320. The interface film pattern 310 may include a low-k material layer of which the dielectric constant k is equal to or lower than about 9, for example, a silicon oxide film (where, k is about 4) or a silicon oxynitride film (where, k is about 4 to about 8 depending on the amount of oxygen atoms and nitrogen atoms). Further, the interface film pattern 310 may include silicate, or may include a combination of the above films.

The gate insulating film pattern 320 is formed on the interface film pattern 310. However, in the case where the interface film pattern 310 does not exist, the gate insulating film pattern 320 may be formed on the isolation film pattern 200 and the first and second fins 110 and 120. The gate insulating film pattern 320 may include a high-k material. For example, the gate insulating film pattern 320 may include HfSiON, HFO$_2$, ZrO$_2$, Ta$_2$O$_5$, TiO$_2$, SrTiO$_3$, and/or BaTiO$_3$. The gate insulating film pattern 320 may have a predetermined thickness depending on the material of the gate insulating film pattern 320. For example, in the case where the gate insulating film pattern 320 is HfO$_2$, the gate insulating film pattern 320 may have a thickness equal to or smaller than 50 Å (about 5 Å to about 50 Å), but is not limited thereto.

The work function adjustment film pattern 330 is formed on the gate insulating film pattern 320. The work function adjustment film pattern 330 is in contact with the gate insulating film pattern 320. The work function adjustment film pattern 330 may serve to adjust the work function of the fins 110 and 120. In an exemplary embodiment, the work function adjustment film pattern 330 may include a single film including TiN or double films including a TiN lower film and a TaN upper film, but is not limited thereto. For example, the work function adjustment film pattern 330 may include, for example, metal nitride and/or metal, such as Mo, Pd, Ru, Pt, TiN, WN, TaN, Ir, TaC, RuN, TiAl, TaAlC, TiAlN, and/or MoN. On the other hand, a capping film (not shown) may be formed between the gate insulating film pattern 320 and the work function adjustment film pattern 330. The capping film (not shown) may serve to adjust the work function of the gate line 300. For example, the capping film (not shown) may serve as a buffer between the gate insulating film pattern 320 and the work function adjustment film pattern 330. The capping film (not shown) may precisely adjust the work function in comparison to a case where only the work function adjustment film pattern 330 exists. The capping film (not shown) may include, for example, LaO, GdO, DyO, SrO, BaO, aluminum oxide film, and/or aluminum metal oxide film, but is not limited thereto.

The gate metal pattern 340 is formed on the work function adjustment film pattern 330. The gate metal pattern 340 is in contact with the work function adjustment film pattern 330. For example, the gate metal pattern 340 may fill in a space between adjacent fins 110 and 120 that are covered by the work function adjustment film pattern 330. The gate metal pattern 340 may include a conductive material, for example, W and/or Al, but is not limited thereto.

The source/drain 360 is formed on both sides of the gate line 300, and is formed in the first and second fins 110 and 120. The source/drain 360 and the gate line 300 are insulated by the gate spacers 350.

The gate spacer 350 is formed on both side surfaces of the gate line 300. The gate spacer 350 may include a nitride film, an oxynitride film, and/or a low-k dielectric material. Further, the gate spacer 350 has a curved side surface. However, the present inventive concept is not limited thereto, and the shape of the gate spacer 350 may differ from that as described above. For example, the gate spacer 350 may have an "I" shape or an "L" shape. The gate spacer 350 includes a single layer, but the present inventive concept is not limited thereto. For example, the gate spacer 350 may include a double layer.

On the other hand, a silicide film (not shown) may be formed on the source/drain 360, and contacts (not shown) may be formed on the silicide film (not shown). The silicide film (not shown) may be formed between the source/drain 360 and the contact (not shown), and may serve to reduce a surface resistance and a contact resistance.

In the case where the semiconductor device according to an embodiment of the present inventive concept is a PMOS transistor, the source/drain 360 may include a compression stress material. The compression stress material may include a material having a lattice constant greater than that of Si. For example, the compression stress material includes SiGe. The compression stress material may apply compression stress to the first and second fins 110 and 120 and may increase mobility of a carrier of a channel region formed in the fins 110 and 120.

In the case where the semiconductor device according to an exemplary embodiment of the present inventive concept is an NMOS transistor, the source/drain 360 may include the same material as that of the substrate 100 or a tension stress material. For example, in the case where the substrate 100 includes Si, the source/drain 360 may include Si or a material having a smaller lattice constant than that of Si (for example, SiC).

The first fin spacers 400 and 410 are not formed on an upper surface of the first fin 110, but are formed on both side walls of the first fin 110. The first fin spacers 400 and 410 may be formed using a heat treatment process (for example, an SPE (Solid Phase Epitaxy) process after depositing an amorphous material (for example, amorphous silicon). In the case of using a heat treatment process with respect to the amorphous material, the amorphous material is crystallized. In this case, the first fin spacers 400 and 410 may include a monocyrstalline material.

The second fin spacers 420 and 430 are not fanned on an upper surface of the second fin 120, but are formed on both side walls of the second fin 120. The second fin spacers 420 and 430 are formed to be in non-contact with the first spacers 400 and 410. The second fin spacers 420 and 430 may be formed using a heat treatment process (for example, an SPE process after depositing an amorphous material (for example, amorphous silicon). In this case, the second fin spacers 420 and 430 may include a monocrystalline material.

Figure 4:
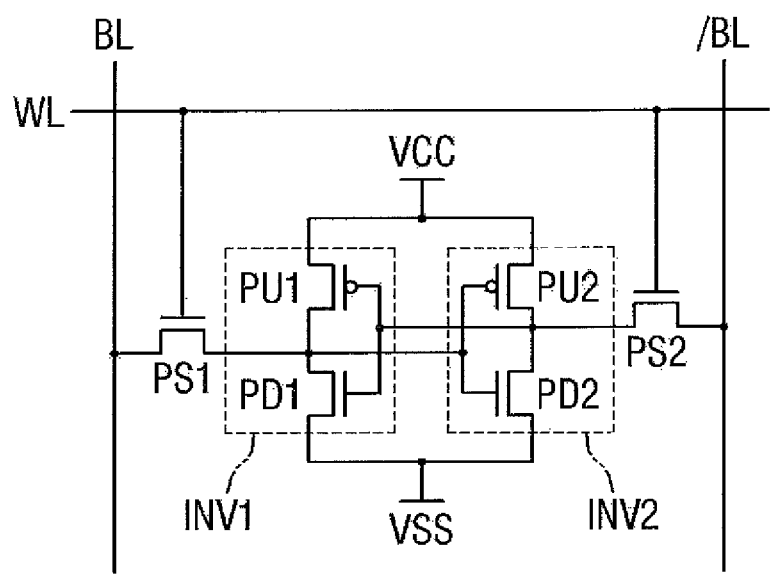
FIGS. 4 and 5 show, respectively, a circuit diagram and a layout diagram of a semiconductor device according to an exemplary embodiment of the present inventive concept.
Figure 5:
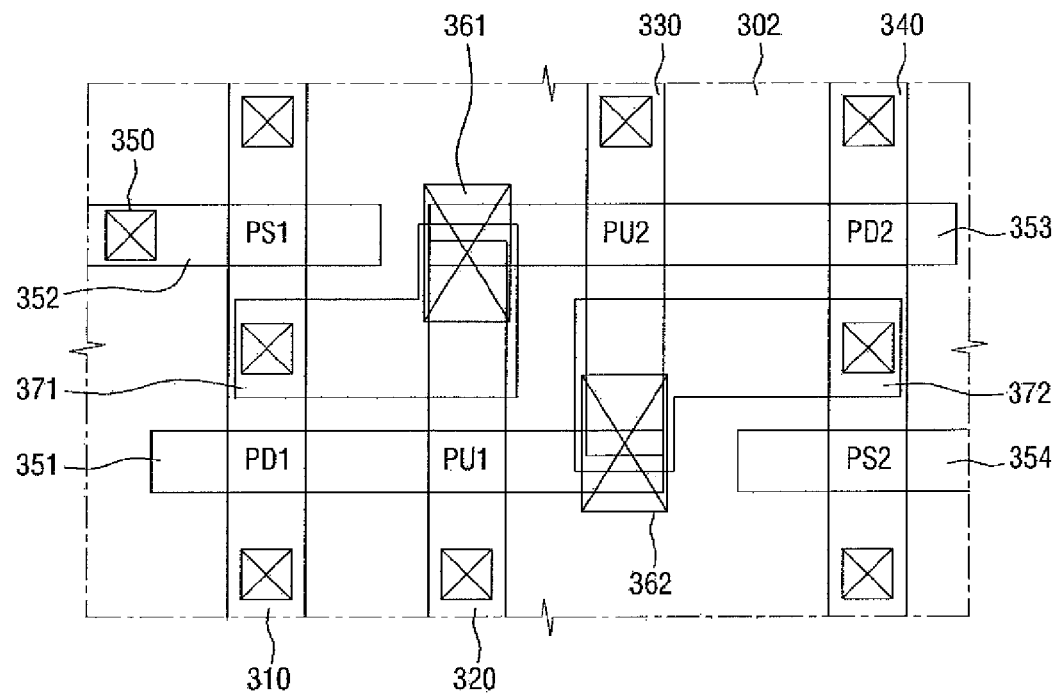
Figure 6:
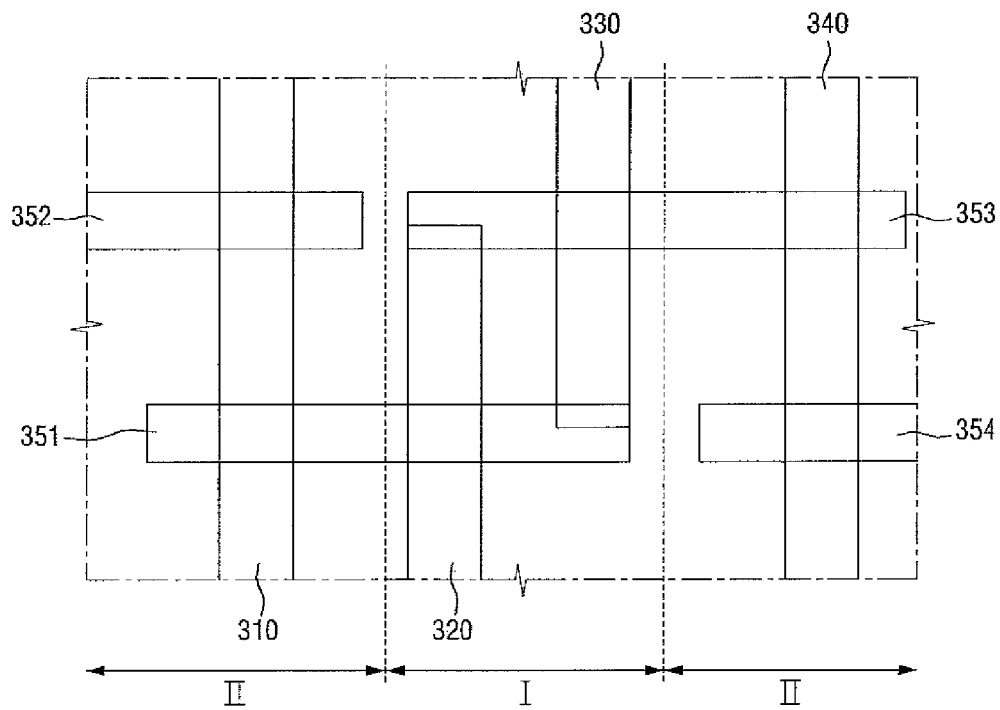
FIG. 6 shows a layout diagram of a plurality of fins and a plurality of gate electrodes in the layout diagram of FIG. 5.

Referring to FIGS. 4 to 6, a semiconductor device according to an exemplary embodiment of the present inventive concept will be described.

FIGS. 4 and 5 show, respectively, a circuit diagram and a layout diagram of a semiconductor device according to an exemplary embodiment of the present inventive concept. FIG. 6 shows a layout diagram for fins and gate electrodes in the layout diagram of FIG. 5. A semiconductor device according to an exemplary embodiment of the present inventive concept is applicable to any devices including general logic elements using fin transistors, but for convenience of explanation, FIGS. 4 to 6 show an SRAM (Static Random Access Memory) device as an example.

Referring to FIG. 4, a semiconductor device according to an exemplary embodiment of the present inventive concept includes a pair of inverters INV1 and INV2 connected in parallel between a power supply node Vcc and a ground node Vss. The semiconductor device also includes a first pass transistor PS1 and a second pass transistor PS2 connected to output nodes of the respective inverters INV1 and INV2. The first pass transistor PS1 and the second pass transistor PS2 are connected to a bit line BL and a complementary bit line /BL. Gates of the first pass transistor PS1 and the second pass transistor PS2 are connected to a word line WL.

The first inverter INV1 includes a first pull-up transistor PU1 and a first pull-down transistor PD1 which are connected in series. The second inverter INV2 includes a second pull-up transistor PU2 and a second pull-down transistor PD2 connected in series. The first pull-up transistor PU1 and the second pull-up transistor PU2 are of PMOS transistors, and the first pull-down transistor PD1 and the second pull-down transistor PD2 are of NMOS transistors.

Further, the first inverter INV1 and the second inverter INV2 constitute a latch circuit in which an input node of the first inverter INV1 is connected to an output node of the second inverter INV2, and an input node of the second inverter INV2 is connected to an output node of the first inverter INV1.

Referring to FIGS. 4 to 6, a first fin 310, a second fin 320, a third fin 330, and a fourth fin 340 are spaced apart from each other. The first to fourth fins 310 to 340 are extended in a second direction Y1. The extending length of the second fin 320 and the third fin 330 are shorter than the extending length of the first fin 310 and the fourth fin 340.

Further, a first gate electrode 351, a second gate electrode 352, a third gate electrode 353, and a fourth gate electrode 354 are extended in a first direction X1 substantially perpendicular to the second direction Y1. The first to fourth gate electrodes 351 to 354 overlap the first to fourth fins 310 to 340. For example, the first gate electrode 351 is extended in the first direction X1, overlapping the first fin 310 and the second fin 320. The first gate electrode partially overlaps a part of a vertical end of the third fin 330. The third gate electrode 353 is extended in the first direction X1, overlapping the fourth fin 340 and the third fin 330 and partially overlapping a part of a vertical end of the second fin 320. The second gate electrode 352 and the fourth gate electrode 354 are extended in the first direction X1, overlapping the first fin 310 and the fourth fin 340, respectively.

As shown in FIG. 5, the first pull-up transistor PU1 may be defined as a region where the first gate electrode 351 and the second fin 320 overlap. The first pull-down transistor PD1 may be defined as a region where the first gate electrode 351 and the first fin 310 overlap. The first pass transistor PS1 may be defined as a region where the second gate electrode 352 and the first fin 310 overlap. The second pull-up transistor PU2 may be defined as a region where the third gate electrode 353 and the third fin 330 overlap. The second pull-down transistor PD2 may be defined as a region where the third gate electrode 353 and the fourth fin 340 overlap. The second pass transistor PS2 may be defined as a region where the fourth gate electrode 354 and the fourth fin 340 overlap.

Recesses (not shown) may be formed on both sides of areas where the first to fourth gate electrodes 351 to 354 and the first to fourth fins 310, 320, 330, and 340, respectively, overlap. The source/drain 360 may be formed in the recess.

Further, a plurality of contacts 350 is formed.

In addition, at a shared contact 361 are simultaneously connected the second fin 320, the third gate electrode 353, and a wiring 371. At a shared contact 362 are simultaneously connected the third fin 330, the first gate electrode 351, and a wiring 372.

Fin transistors according to an exemplary embodiment are implemented in the first pull-up transistor PU1, the first pull-down transistor PD1, the first pass transistor PS1, the second pull-up transistor PU2, the second pull-down transistor PD2, and the second pass transistor PS2.

Hereinafter, referring to FIGS. 7 to 12, a method for fabricating a semiconductor device according to an exemplary embodiment of the present inventive concept will be described.

Figure 7:
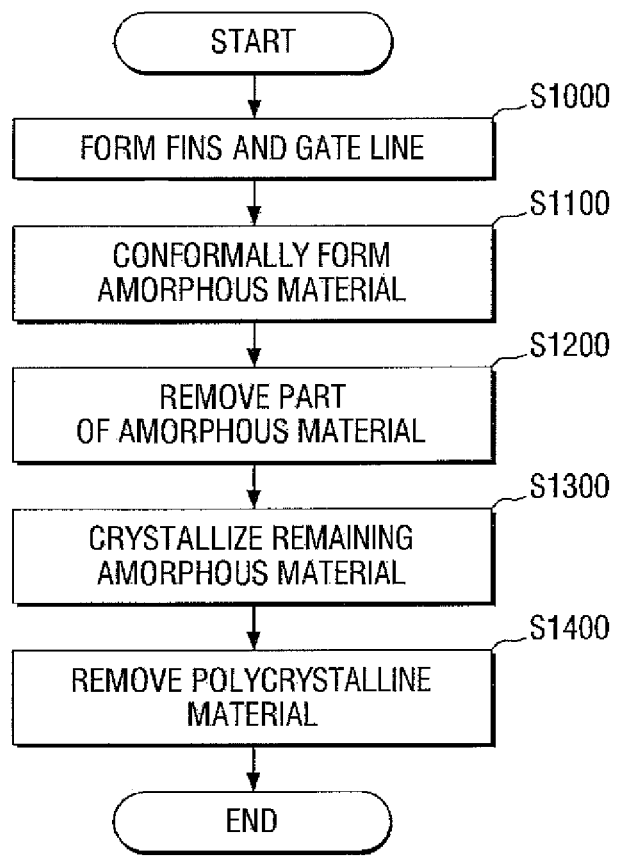
FIG. 7 shows a flowchart of a method for fabricating a semiconductor device according to an exemplary embodiment of the present inventive concept.

FIG. 7 shows a flowchart of a method for fabricating a semiconductor device according to an exemplary embodiment of the present inventive concept. FIGS. 8 and 10 to 13 are perspective views of resulting structures from intermediate steps of the flowchart of FIG. 7. FIG. 9 shows a cross-sectional view taken along line C-C' in FIG. 8.

Figure 8:
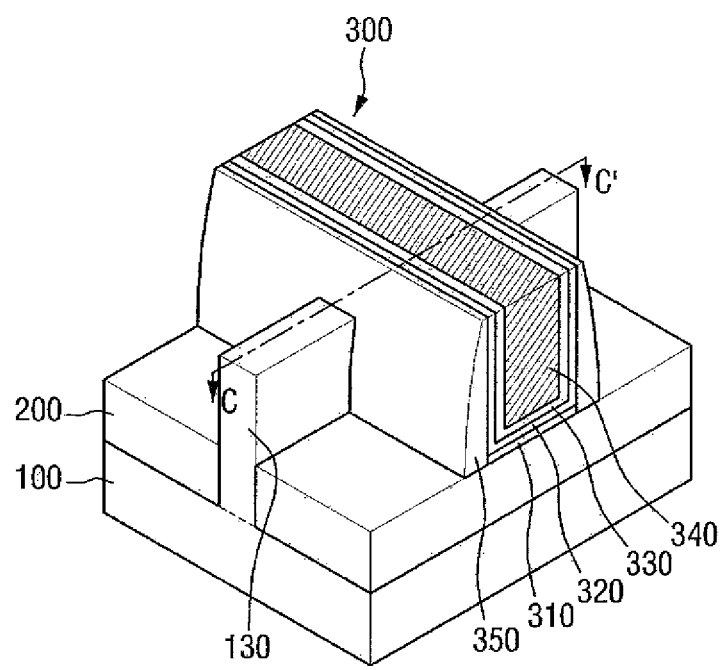
FIG. 8 shows a perspective view of an intermediate step of fabricating a semiconductor device according to an exemplary embodiment of the present inventive concept.
Figure 9:
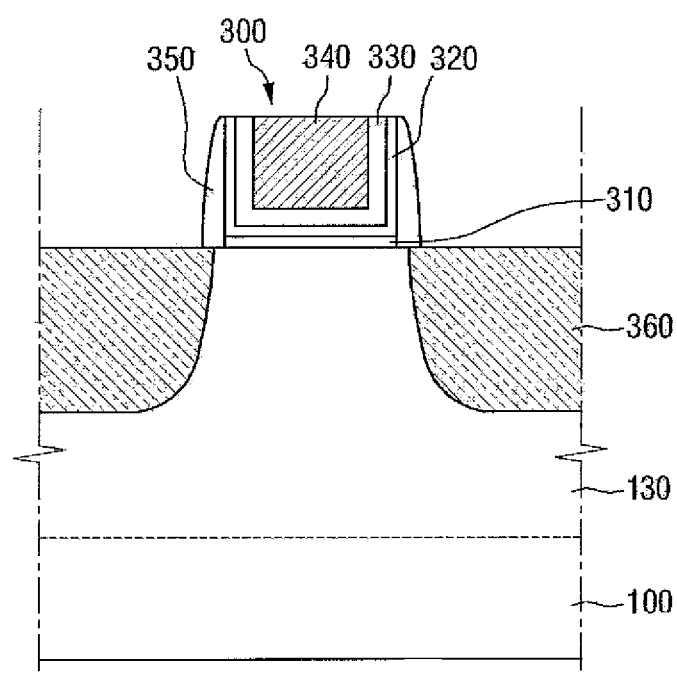
FIG. 9 shows a cross-sectional view taken along line C-C' in FIG. 8.

Referring to FIGS. 7 to 9, in S1000, a substrate 100 having a fin 130 is provided, and a gate line 300 is formed on the fin 130 in a second direction Y1.

The fin 130 is extended along the second direction Y1. The fin 130 may be a part of the substrate 100, and may include an epitaxial layer grown from the substrate 100. A predetermined amount of impurity may be doped in the fin 130 to adjust a threshold voltage of a semiconductor device including the gate line 300 and the fin 130. If the semiconductor device is an NMOS transistor, an impurity may be boron (B). Further, if the semiconductor device is a PMOS transistor, the impurity may be phosphorus (P) or arsenic (As). However, the present inventive concept is not limited thereto, and the doping may be performed using other impurities. The fin 130 may be formed in various processes including, for example, an epitaxial process, and/or an etching process.

An isolation film pattern 200 is formed on the substrate 100. The isolation film pattern 200 may include a silicon oxide film, a silicon nitride film, and/or a silicon oxynitride film. For example, the isolation film pattern 200 is formed to expose upper side walls of the fins 130. According to an exemplary embodiment, a preliminary isolation film layer (not shown) may be formed on the substrate 100 having the fin 130, and the preliminary isolation film layer (not shown) may be partially removed using a mask film pattern (not shown) to form the isolation film pattern 200. In this case, the height of the exposed upper side wall of the fin 130 may be adjusted according to an etching time of the preliminary isolation film layer (not shown). As shown in FIG. 8, the isolation film pattern 200 formed through such an etching process covers lower side walls of the fin 130. The isolation film pattern 200 serves to electrically/physically separate the fins 130 from each other.

On the isolation film pattern 200 and the fin 130, the gate line 300 is formed to extend in a first direction X1 substantially perpendicular to the second direction Y1. The gate line 300 may be formed by sequentially laminating an interface film pattern 310, a gate insulating film pattern 320, a work function adjustment film pattern 330, and a gate metal pattern 340.

For the convenience of explanation, a process step for forming the gate line 300 will be omitted. The process step was described in detail with reference to FIGS. 8 and 9.

A source/drain 360 may be formed by injecting N-type or P-type impurities into both sides of the exposed fin 130 after a dummy gate pattern (not illustrated) is formed before the gate line 300 is formed.

Figure 10:
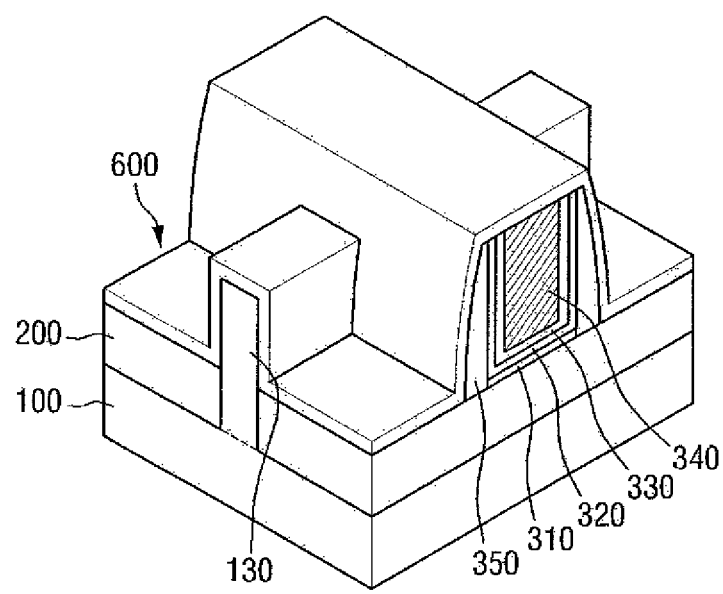
FIGS. 10 to 13 show perspective views of intermediate steps of fabricating a semiconductor device according to an exemplary embodiment of the present inventive concept.

Referring to FIGS. 7 and 10, in step S1100, an amorphous material 600 is conformally formed to cover the resulting structure of the S1000—e.g., the isolation film pattern 200, the fins 130, and the gate line 300. The amorphous material 600 may include, for example, amorphous silicon. The amorphous material 600 may include Ge, B, As, and/or P together with the amorphous silicon (Si). For example, in the case of depositing the amorphous silicon, the amorphous silicon is formed as a junction region, and thus dopants of Ge B, As, and/or P may be doped depending on whether the semiconductor device is of NMOS or PMOS type.

Further, the amorphous material 600 may include a thickness ranging from about 10 Å to about 1000 Å.

Figure 11:
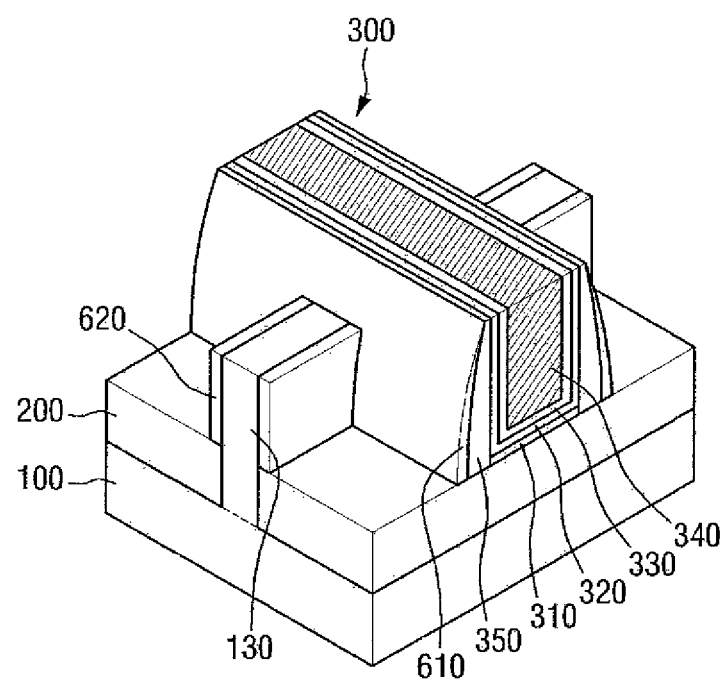

Referring to FIGS. 7 and 11, in S1200, the amorphous material 600 is partially removed using an etch-back process and a first remaining amorphous material 610 remains on both side walls of the fin 130 and a second remaining amorphous material 620 remains on both sidewalls of the gate spacers 350. In the case of using the etch-back process, the amorphous material 600 formed on an upper surface of the isolation film pattern 200, upper surfaces of the fins 130, and an upper surface of the gate line 300 are removed.

Figure 12:
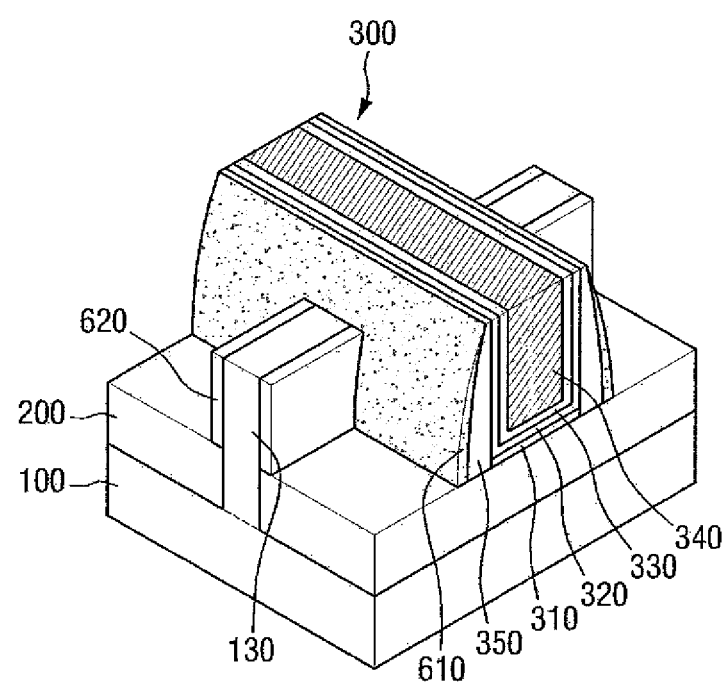

Referring to FIGS. 7 and 12, in S1300, remaining amorphous materials 610 and 620 are crystallized to form a polycrystalline material and a monocrystalline, respectively. For example, the amorphous material 610 deposited on the gate spacers 350 is converted into a polycrystalline material, and the amorphous material 620 deposited on both side walls of the fins 130 is converted into a monocrystalline material. The amorphous material deposited on the gate spacers 350 has no underlying layer having a monocrystalline structure and thus is crystallized into the polycrystalline material in a subsequent annealing process. The amorphous material 620 is deposited on both side walls of the fins 130 having a monocrystalline structure, and thus is crystallized into the monocrystalline structure in a subsequent annealing process. According to an exemplary embodiment, the remaining amorphous materials 610 and 620 may be crystallized using an SPE process including a RTP (Rapid Thermal Process) or a MSA (Milli-Second Annealing) process.

The RTP process may include a step of ramping up temperature with a temperature step ranging from about 10° C. per second to about 100° C. per second. When the temperature reaches a predetermined temperature, for example, about 500° C. or more, the RTP process may perform a step of annealing for about one minute to about one hour, thereby the remaining amorphous materials 610 and 620 being crystallized.

In the MSA process, a high-temperature state below a melting temperature of silicon (for example, 1000° C.) is maintained in a short time for annealing the remaining amorphous materials 610 and 620 after the high-temperature is reached, and the remaining amorphous materials 610 and 620 are crystallized. In the case of the MSA annealing, the high-temperature annealing may increase solid phase diffusion of silicon atoms in the remaining amorphous materials 610 and 620, and the monocrystalline structure obtained by MSA annealing is of higher quality than that obtained by the RTP process.

Figure 13:
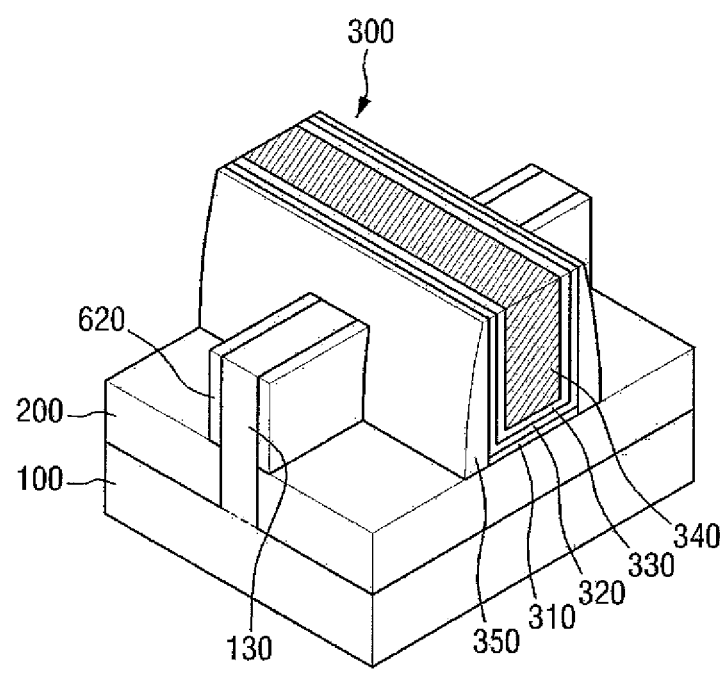

Referring to FIGS. 7 and 13, in S1400, the polycrystalline material is removed, and thus the monocrystalline material remains on both side walls of the fins 130 to form fin spacers. The polycrystalline material may be removed using a poly etchant that selectively removes the polycrystalline material. For example, the poly etchant has good etch selectivity with respect to the monocrystalline material. The polycrystalline material formed on the gate spacers 350 are removed using the poly etchant. The monocrystalline material on both side walls of the fin 130, however, remains. For example, the poly etchant may include hydrofluoric acid (HF) and/or nitric acid ($HNO_3$).

Figure 14:
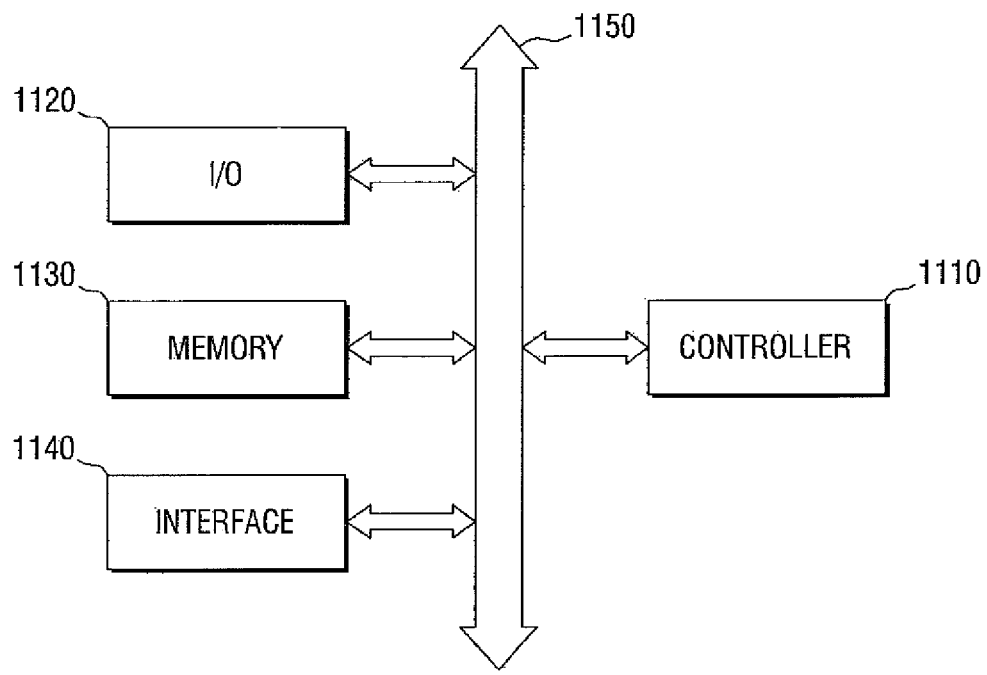
FIG. 14 shows a block diagram of an electronic system including a semiconductor device according to an exemplary embodiment of the present inventive concept.

FIG. 14 is a block diagram of an electronic system including a semiconductor device according to an exemplary embodiment of the present inventive concept.

Referring to FIG. 14, an electronic system 1100 according to an exemplary embodiment of the present inventive concept may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include a microprocessor, a digital signal processor, a microcontroller, and/or logic elements. The logic elements may function as a microprocessor, a digital signal processor and/or a microcontroller. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. The electronic system 1100 may further include a high-speed DRAM (Dynamic Random Access Memory) and/or SRAM as an operating memory for the controller 1110. The memory 1130, the controller 1110 and/or the I/O device 1120 may include a fin field-effect transistor according to an exemplary embodiment of the present inventive concept.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 15:
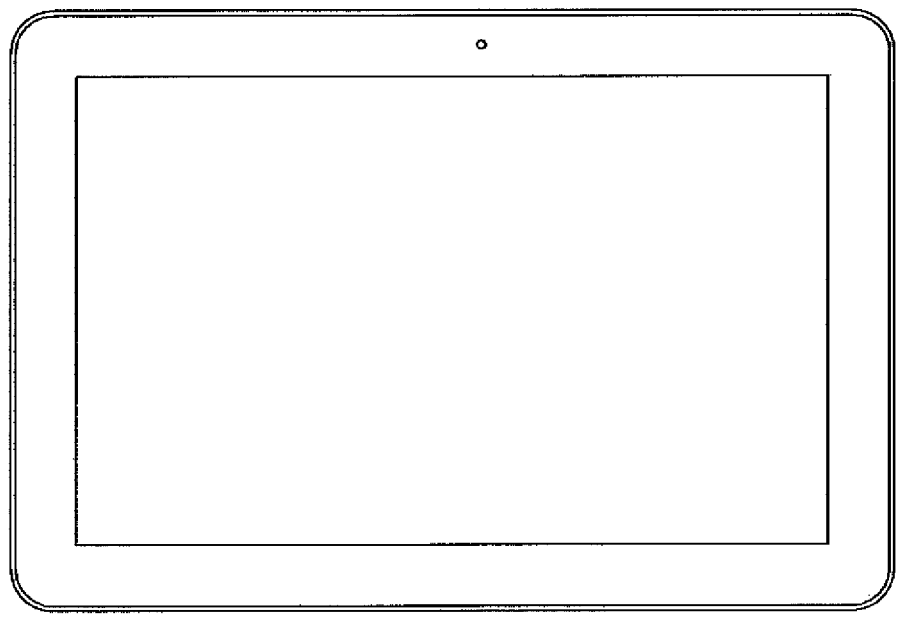
FIGS. 15 and 16 show exemplary views of a semiconductor system including a semiconductor device according to an exemplary embodiment of the present inventive concept.
Figure 16:
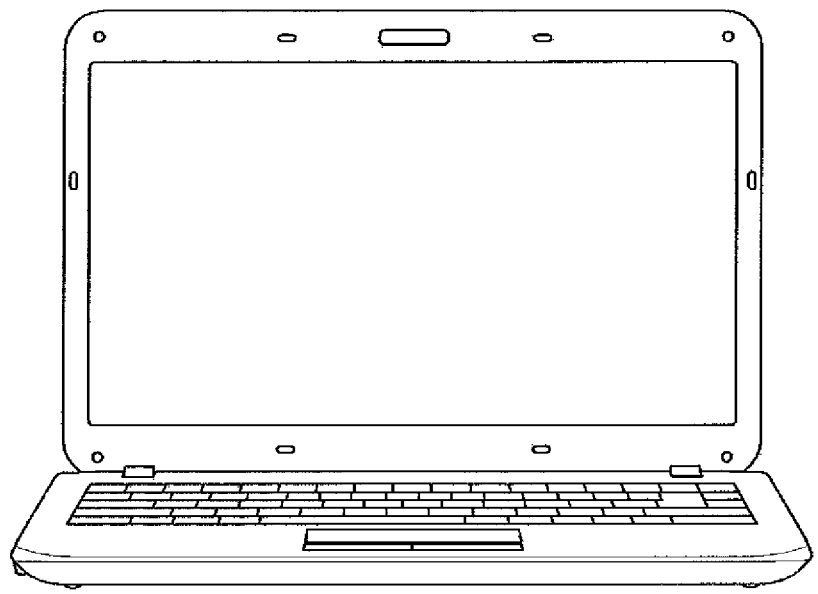

FIGS. 15 and 16 are views of a semiconductor system that includes a semiconductor device according to an exemplary embodiment of the present inventive concept. FIG. 15 shows a tablet PC, and FIG. 16 shows a notebook PC. The tablet PC or the notebook PC may include a semiconductor device according to an exemplary embodiment of the present inventive concept. The semiconductor device according to an exemplary embodiment of the present inventive concept is applied to various other integrated circuit devices, for example. While the present inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A method for fabricating a semiconductor device, comprising:
    forming a fin protruded from a substrate and extended in a first direction and;
    forming a gate line on the fin and the substrate, wherein the gate line is extended in a second direction crossing the first direction;
    conformally forming an amorphous material layer to cover the substrate, the fin, and the gate line;
    removing a part of the amorphous material layer to form a first remaining amorphous layer on side walls of the fin and a second remaining amorphous layer on side walls of the gate line;
    annealing the first remaining amorphous layer and the second remaining amorphous layer to crystallize the first remaining amorphous material layer and the second remaining amorphous material layer into a monocrystalline material layer and a polycrystalline material layer, respectively; and
    removing the polycrystalline material layer.

2. The method for fabricating a semiconductor device of claim 1, further comprising:
    forming an isolation film pattern on the substrate, wherein the isolation film pattern covers lower parts of the side walls of the fin.

3. The method for fabricating a semiconductor device of claim 1, wherein the amorphous material layer includes amorphous silicon.

4. The method for fabricating a semiconductor device of claim 3, wherein the amorphous material includes Ge, B, As, or P.

5. The method for fabricating a semiconductor device of claim 1, wherein the amorphous material layer includes a thickness ranging from about 10 Å to about 1000 Å.

6. The method for fabricating a semiconductor device of claim 1, wherein the amorphous material layer is removed using an etch-back process.

7. The method for fabricating a semiconductor device of claim 6, wherein the etch-back process partially removes the amorphous material layer formed on an upper surface of the substrate, an upper surface of the fin, and an upper surface of the gate line.

8. The method for fabricating a semiconductor device of claim 1, wherein the crystallizing the remaining amorphous material is performed using a RTP (Rapid Thermal Process) at a process temperature of about 500° C. or higher.

9. The method for fabricating a semiconductor device of claim 1, wherein the crystallizing the remaining amorphous material is performed using a MSA (Milli-Second Annealing) process at a process temperature of about 1200° C. or lower.

10. The method for fabricating a semiconductor device of claim 1, wherein the polycrystalline material layer is removed using an etchant having etch selectivity with respect to the monocrystalline material layer.

11. The method for fabricating a semiconductor device of claim 10, wherein the etchant comprises hydrofluoric acid (HF) or nitric acid ($HNO_3$).

* * * * *